(12) United States Patent
Farshchian

(10) Patent No.: US 11,982,698 B2
(45) Date of Patent: May 14, 2024

(54) JOINT DENOISING AND DELAY ESTIMATION FOR THE EXTRACTION OF PULSE-WIDTH OF SIGNALS IN RF INTERFERENCE

(71) Applicant: BAE SYSTEMS Information and Electronic Systems Integration Inc., Nashua, NH (US)

(72) Inventor: Masoud Farshchian, Englewood Cliffs, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 814 days.

(21) Appl. No.: 17/128,825

(22) Filed: Dec. 21, 2020

(65) Prior Publication Data

US 2022/0196793 A1   Jun. 23, 2022

(51) Int. Cl.
*G01S 7/28* (2006.01)
*G01R 29/02* (2006.01)
(Continued)

(52) U.S. Cl.
CPC ......... *G01R 29/023* (2013.01); *G01R 29/033* (2013.01); *G01S 5/0278* (2013.01);
(Continued)

(58) Field of Classification Search
CPC .. G01R 29/023; G01R 29/027; G01R 29/033; G01S 13/762; G01S 5/0278; G01S 7/021; G01S 7/36; G06F 17/14; G06F 17/16
See application file for complete search history.

(56) References Cited

U.S. PATENT DOCUMENTS 6,911,859 B2   6/2005 Komiak
9,277,418 B1   3/2016 Farshchian
(Continued)

OTHER PUBLICATIONS

Office Action for U.S. Appl. No. 16/865,639, dated Mar. 4, 2021, 16 Pages.
(Continued)

*Primary Examiner* — Tan H Trinh
(74) *Attorney, Agent, or Firm* — Maine Cernota & Curran

(57) ABSTRACT

A feature detection system, the system comprising: at least one processor in operative communication with a signal source, said processor further comprising at least one non-transitory storage medium, wherein at least one non-transitory storage medium contains instructions configured to cause the processor to: apply a joint group sparse denoising and delay estimation approach to a signal received from said signal source; and output statistics regarding the signal, wherein the joint group sparse denoising and delay estimation approach comprises; using the following equation:

$$\{x^*, \tau^*\} = \underset{x,\tau}{\operatorname{argmin}}\left\{\frac{1}{2}\sum_{j=1}^{M}\|y_j - x\|_2^2 + \sum_{i=0}^{N}\lambda_i\varphi_i(D_i^{l_i}x)\right\}$$

where: $\phi_i$ are regularization functions; $\|y-x\|_2^2$ is a data-fidelity term and, in embodiments, is chosen as the least-square term; $l_i$ are real numbers; $D_i$ are operators, which may be linear filters that can be written in matrix form; $\lambda_i$ are regularization parameters; and $x^*, \tau^*$ represent estimates of at least one transmitted pulse and associated delay, and solving the equation for multiple values of $\epsilon$; choosing a vector, x, such that a cost function comprising the data fidelity term and regularization function is minimized; determining the $\epsilon$ that corresponds to the x that minimizes the
(Continued)

cost function; and calculating the pulse width of the received signal, which corresponds to the desired estimate of the vector, x.

20 Claims, 10 Drawing Sheets

(51) Int. Cl.
| | |
|---|---|
| G01R 29/033 | (2006.01) |
| G01S 5/02 | (2010.01) |
| G01S 7/36 | (2006.01) |
| G01S 13/02 | (2006.01) |
| G01S 13/76 | (2006.01) |
| G01R 29/027 | (2006.01) |
| G06F 17/14 | (2006.01) |
| G06F 17/16 | (2006.01) |

(52) U.S. Cl.
CPC .............. *G01S 7/36* (2013.01); *G01R 29/027* (2013.01); *G01S 13/762* (2013.01); *G06F 17/14* (2013.01); *G06F 17/16* (2013.01)

(56) References Cited

U.S. PATENT DOCUMENTS

| | | | | |
|---|---|---|---|---|
| 9,734,601 | B2* | 8/2017 | Bresler | ................ G06T 11/006 |
| 10,027,368 | B2 | 7/2018 | Gravely | |
| 11,088,877 | B1 | 8/2021 | Farshchian | |
| 11,156,647 | B1 | 10/2021 | Farshchian | |
| 2004/0135717 | A1* | 7/2004 | Gounalis | ................ G01S 7/021 |
| | | | | 342/13 |
| 2011/0085612 | A1 | 4/2011 | Muraoka et al. | |
| 2013/0336425 | A1 | 12/2013 | Lee et al. | |
| 2017/0078897 | A1* | 3/2017 | Duan | ................... H04W 24/02 |
| 2017/0094527 | A1 | 3/2017 | Shattil et al. | |
| 2018/0123633 | A1 | 5/2018 | Graveley et al. | |
| 2018/0145824 | A1 | 5/2018 | Carroll | |
| 2018/0348336 | A1* | 12/2018 | Jahan | ...................... G01S 11/02 |
| 2019/0020504 | A1* | 1/2019 | Ray | ......................... H04L 27/22 |
| 2020/0184997 | A1 | 6/2020 | Lawson et al. | |

OTHER PUBLICATIONS

Ivan Selesnick (Total Variation Denoising (an MM algorithm)), Sep. 10, 2012. Last edit: Jan. 23, 2017: http://eeweb.poly.edu/iselesni/lecture_notes/TVDmm/.

Ivan Selesnick (Total Variation Denoising via the Moreau Envelope), IEEE Signal Processing Letters (preprint), p. 1-7, arXic; 1701.00439v1 [math.OC] Jan. 2, 2017.

Office Action for U.S. Appl. No. 16/894,285, dated Jul. 27, 2021, 14 Pages.

Office Action for U.S. Appl. No. 16/943,002, dated Feb. 3, 2022, 27 Pages.

Office Action for U.S. Appl. No. 16/894,285, dated Apr. 8, 2021, 13 Pages.

Tektronix, "Fundamentals of Radar Measurements", no date, www.tektronix.com/radar, pp. 1-52.

T. F. Chan, S. Osher, and J. Shen. The digital TV Filter and nonlinear denoising. IEEE Trans. Image Process., 10 (2):231{241, Feb. 2001.

Combettes, Patrick L., and Jean-Christophe Pesquet. "Proximal splitting methods in signal processing." Fixed-point algorithms for inverse problems in science and engineering. Springer, New York, NY, 2011. 185-212.

Dr. Farshchian, Masoud. "A new TDOA estimator using joint-optimization and non-convex group sparse penalty functions." 13 Pages.

Pace, Phillip E. Detecting and classifying low probability of intercept radar. Artech House, 2009.

Gardner, William A. "An introduction to cyclostationary signals." Cyclostationarity in communications and signal processing (1994): 1-90.

Dr. Farshchian, Masoud and Alexander, William. "A method to estimate multi-periodic signals and detect their features in interference." 2019. 10 Pages.

Bach, Francis, et al. "Structured sparsity through convex optimization." Statistical Science 27.4 (2012): 450-468.

Selesnick, Ivan W., and Ilker Bayram. "Sparse signal estimation by maximally sparse convex optimization." IEEE Transactions on Signal Processing 62.5 (2014): 1078-1092.

E. J. Candes, M. B. Wakin, and S. P. Boyd, "Enhancing sparsity by reweighted L1 minimization," J. Fourier Anal. Appl., vol. 14, No. 5-6, pp. 877-905, Dec. 2008.

Afonso, Manya V., José M. Bioucas-Dias, and Mário AT Figueiredo. "An augmented Lagrangian approach to the constrained optimization formulation of imaging inverse problems." IEEE Transactions on Image Processing 20.3 (2011): 681-695.

Figueiredo, Mário AT, José M. Bioucas-Dias, and Robert D. Nowak. "Majorization-minimization algorithms for wavelet- based image restoration." IEEE Transactions on Image processing 16.12 (2007): 2980-2991.

\* cited by examiner

Original Ideal Pulse

PSD of the Original Signal

Time domain signal with interference+noise

Estimated and Ideal Pulse

JOINT DENOISING AND DELAY ESTIMATION FOR THE EXTRACTION OF PULSE-WIDTH OF SIGNALS IN RF INTERFERENCE

FIELD OF THE DISCLOSURE

The following disclosure relates generally to signal processing and, more specifically, to extraction of the pulse-width of signals in Radio Frequency (RF) interference.

BACKGROUND

Modern Radio Frequency (RF) defense systems operate in increasingly congested/contested electromagnetic (EM) environments. Unwanted interferers and signals of interest from adversaries, or even from friendly sources, in theater all contribute to high levels of noise.

The transmitted pulse-width of a sensor or communication systems provides a key marker for the identification of the type of the system, and is used, in part, to identify unknown transmitters as of a type used by friends or foes in Electronic Warfare (EW) applications. Furthermore, this characteristic is a traditional parameter of a pulse descriptor word (PDW), a description of primarily immutable characteristics that uniquely identify a radar transmitter type.

In the case of moderate to low signal-to-noise ratio EM environments, such as those that commonly occur in EW applications, the ability to accurately measure the pulse-width, using current systems and methods, and thus the ability to accurately identify a radar type, is severely degraded. The advent of Low Probability of Intercept (LPI) and Low Probability of Detection (LPD) radar systems, which use various techniques to obscure their signals from analysis, exacerbates this issue. As a result, they are a very real threat to air, land, and sea operations.

What is needed, therefore, are systems and methods that increase the accuracy and precision with which pulse width measurements can be obtained, especially in low signal-to-noise ratio and signal-to-interference ratio environments.

SUMMARY

In embodiments, a novel denoising optimization formulation is presented and two special cases are solved using a fast iterative optimization algorithm, providing for accurate pulse-width measurement at lower signal-to-noise ratios and lower signal-to-interference ratios than is possible using current system and methods. Embodiments provide increased accuracy of emitter identification and/or the ability to identify threats at greater distances.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

Figure 1:
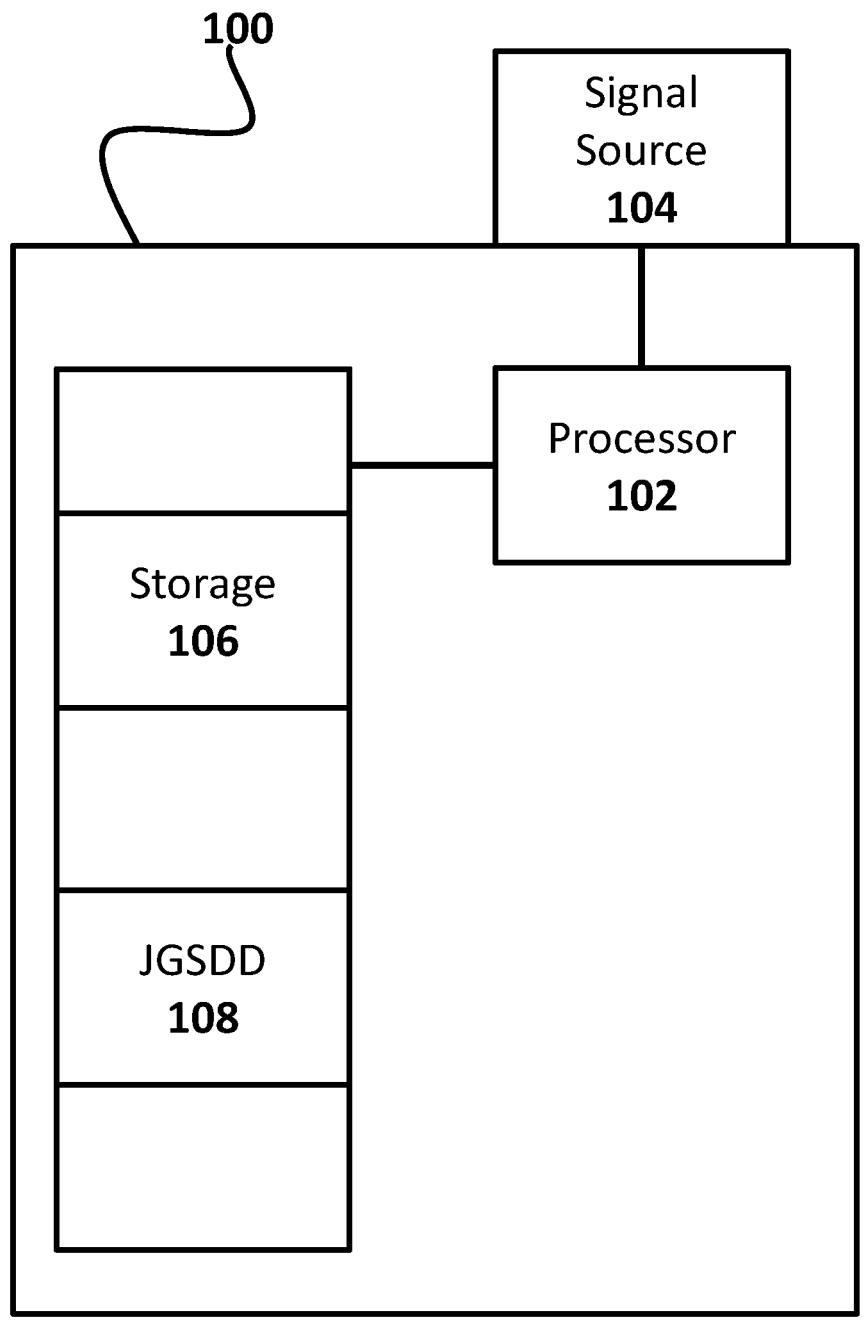
FIG. 1 is a diagram depicting a feature detection apparatus in accordance with embodiments of the present disclosure.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

A variety of acronyms are used herein to describe both the subject of the present disclosure and background therefore. A brief listing of such acronyms is provided below:

ADMM—Alternating Direction Method of Multipliers;

ADC—Analog-to-Digital Converter, a device used to convert analog signals to digital signals;

DCR—Direct Conversion Receive, direct conversion of an RF signal to samples;

I/Q—In-band/Quadrature, signal types;

JGSDD—Joint Group-Sparse Denoising and Delay, a method of determining pulse width based on majorization minimization techniques;

NC—Non-Convex;

NC-GTVD—A more generalized form of TVD where the penalty function is non-separable and non-convex;

PCG—Preconditioned Conjugate Gradient, a method for the numerical solution of particular systems of linear equations, namely those whose matrix is symmetric and positive-definite. The conjugate gradient method is often implemented as an iterative algorithm, applicable to sparse systems that are too large to be handled by a direct implementation or other direct methods, such as the Cholesky decomposition method;

PDW—Pulse Descriptor Word, a group of characteristics of a radar pulse that can be used to identify the type of radar responsible for generating the pulse;

PRI—Pulse Repetition Interval, the time between sequential pulses;

Pulse-Width—The elapsed time between the rising and falling edges of a single pulse;

Rise-time—Rise-time is defined as the time it takes for a pulse to reach from 10% to 90% maximum height. It is estimated after the denoising algorithm presented in this patent;

RMS—Root-Mean Square;

RMSE—Root Mean Square Error;

SNR—Signal to Noise Ratio;

TDOA—Time Difference of Arrival; and

TVD—Total Variation Denoising, a Signal Processing optimization technique that penalizes the variation of the signal in combination with its first derivative coefficients assumed to be sparse in order to estimate it.

Without any limitations, two embodiments representing pulse-width estimation observed by two channels in white noise and one embodiment representing pulse-width estimation color noise interference, which is applicable to RF congested environments, are presented herein.

More specifically, herein we provide systems and methods for estimating the pulse-width of a signal at relatively low signal-to-noise ratios, in embodiments using a large-scale, non-differentiable, iterative joint-optimization algorithm. The optimization approach of embodiments includes the use of a data-fidelity term and a regularization function and combines multiple observations from different spatial elements or multiple temporal snapshots to provide a more accurate pulse-width measurement in noise than is currently obtainable. Experimental results are provided to demonstrate the accuracy of the new method, relative to current measurement techniques.

Now referring specifically to FIG. 1, an embodiment of the present disclosure is depicted. This embodiment shows a feature detection system 100 comprising a signal source 104 connected to a processor 102 that is in communication with a non-transitory storage medium 106 that contains instructions configured to cause the processor to operate a Joint Group-Sparse Denoising and Delay (JGSDD) module 108.

In one example the signal source 104 comprises a receiver coupled to an antenna that receives various incoming RF signals. The receiver, in one example, has various receiver components such as filters, mixers, amplifiers and also an Analog-to-Digital Converter (ADC) configured to convert analog signals to digital signals. After a digitization process, the receive signal, in embodiments, comprises complex in-band and quadrature band (I/Q) complex signals. In embodiments, other methods to obtain complex I/Q signals, including direct conversion receive (DCR), where the RF signal is directly converted to (I/Q) samples, are used. In still other embodiments, the receiver obtains complex I/Q signals.

The processor can be one or more processors coupled to memory or a non-transitory storage medium 106 that contains various software routines or is otherwise configured to carry out the methods and techniques described herein. In one exemplary embodiment, the digital signals from the signal source 104 are processed through the JGSDD, which denoises the signals, thereby enhancing the signal-to-interference ratio for the feature estimation of the signal of interest.

Figure 2:
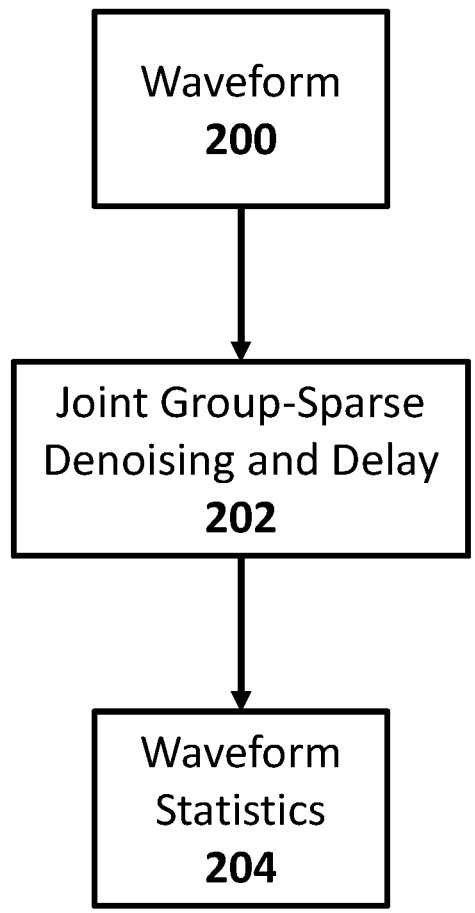
FIG. 2 is a flowchart describing a method of Joint Group-Sparse Denoising and Delay (JGSDD), in accordance with embodiments of the present disclosure.

FIG. 2 discloses a high-level method of estimating multiperiodic signals and detecting their features, in accordance with embodiments of the present disclosure. More specifically, FIG. 2 discloses obtaining a waveform 200 that comprises complex I/Q signals; subjecting the waveform to a Joint Group-Sparse Denoising and Delay (JGSDD) analysis 202, thereby enhancing its signal-to-noise ratio; and outputting waveform statistics 204, which may also herein be referred to as features, in embodiments peak values, locations of peaks and troughs, periodicity or lack thereof, and other signal features used for detection and classification of the waveform (i.e. the signal).

An optimization-based, non-linear filter that is well-suited for the estimation of signals that are sparsified with respect to some filters corrupted by additive white Gaussian noise is proposed in Equation (1). More specifically, Equation 1 provides a non-limiting example of a very general estimation problem involving an N-dimensional signal, x, corrupted by additive white Gaussian noise (AWGN), v, with multiple observations $y_i$, where each observation has a separate amplitude scale $\epsilon_i \in \mathcal{E}$, and delay $\sigma_i \in \sigma$, to give $y_i = \epsilon_i x(n-\sigma_i) + V_i$, and is defined by the optimization problem:

$$\{x^*, \tau^*\} = \underset{x,\tau}{\mathrm{argmin}} \left\{ \frac{1}{2} \sum_{j=1}^{M} \|y_i - x\|_2^2 + \sum_{i=0}^{N} \lambda_i \varphi_i(D_i^{l_i} x) \right\} \qquad \text{Equation (1)}$$

In Equation (1), the optimization technique does not usually have a closed form solution, i.e. it cannot be evaluated in a finite number of operations, and must be solved iteratively. As used in the above equation, $\phi_i$ are regularization functions, which may also be referred to herein as penalty functions; the term $\|y-x\|_2^2$ is a data-fidelity term and, in embodiments, is chosen as the least-square term, due to the Gaussinity of the noise, although other metrics may be used; $l_i$ are real numbers; $D_i$ are operators, which may be linear filters that can be written in matrix form; and $\lambda_i$ are regularization parameters. The regularization function models our a priori knowledge of some characteristics of the signal, x. Finally, the transmitted pulse, and delay of each channel are estimated and denoted by $x^*$, $\sigma^*$.

For the example results disclosed herein, we first define a mixed norm in Equation (1) for the regularization component:

$$\phi_G(x) = \sum_{i=1}^{N} [\sum_{k=0}^{k-1} V_k |x(i+k)|^2]^{1/2} \qquad \text{Equation (2)}$$

In Equation (2), K represents the group size and $V_k$ is a window function. For the analysis below, without any limit, we set the window function to be uniform so that coefficients of $\phi_G(X)$ within a group size K are given the same weight. $\phi_G(X)$, as used here, represents a special case of a general sum of $\phi_i$ regularization terms. Furthermore, as used herein, uniform should be understood to refer to each of the coefficients of the window having the same weight. In embodiments, the window, V, is not uniform.

Rather than penalizing high values of $\phi_G(X)$ in Equation (1), we may penalize $\phi_G(D^m x)$ where $D^m$ is the $m^{th}$ order difference operator, which can be written as a difference matrix. For m=1, D is an (N−1)×N difference matrix where the first row is [−1 1 zeros(1,N−2)]. $D^2$ is similarly defined as a (N−2)×N matrix with the first row [−1 2 −1 zeros(1,N−3)]. Each additional row is then shifted by one zero to the right, relative to the previous row. The rows of the difference matrix, D, can be written as any filter, including a notch filter. We also note that as a special case, K=1 in Equation (2) represents the total variation norm which penalizes large difference in the underlying signal.

This model takes into account that the derivative of the pulse has groups of coefficients that are clustered together and is designed to penalize large clusters of non-zero derivative coefficients. For the experimental results described herein, the first order difference penalty function $\phi_G(Dx)$, which penalizes a cluster of derivative coefficients, is used in Equation (1). For the case of K=1, $\phi_G(Dx)$ collapses to |Dx|, which is the first order difference norm.

Now regarding specifically what is herein referred to as Joint Group-Sparse Denoising and Delay (JGSDD) techniques, an iterative solution of Equation (1) that employs such a technique consists, solving Equation (1) for multiple values of delays in order to estimate a vector x for each candidate delay, such that the cost function of Equation (1), which comprises the data fidelity term and the regularization function, is minimized. Then, the σ* (the true time-delay between the two channels) that corresponds to the x* vector that jointly minimize the cost function across all candidate delays is the estimated optimal delay. Once x* is obtained, then the pulse-width can be calculated by its half-value between the interval of its rise-time and fall-time. Besides the half-value, one can also use other desired values between the rise-time and fall-time to obtain estimated pulse-width values.

Such a solution is derived, in embodiments, by various methods including: Majorization Minimization, Proximal Methods, Forward-Backward Splitting, and other non-linear, convex optimization techniques. An algorithm using Majorization-Minimization (denoted by joint group-sparse denoising and delay (JGSDD) estimator representing an embodiment of the present invention) is presented below to measure the pulse-width from the output of multiple channels (Figueiredo, Mario A T, et al. "On total variation denoising: A new majorization-minimization algorithm and an experimental comparison with wavelet denoising." 2006 International Conference on Image Processing. IEEE, 2006.). Each estimate of x at each iteration L, is denoted by $x^{(L)}$. Here we assume that the SNR for both channels are similar (M=2 in Equation (1)); if they are estimated to be different, then the coefficient vectors of $w_1$ and $w_2$ of weights for the two data-fidelity terms can be set to a function of the SNR that is linear or quadratic or another arbitrary function designed to emphasize the higher SNR channel relative to the lower SNR channel.

Figure 3:
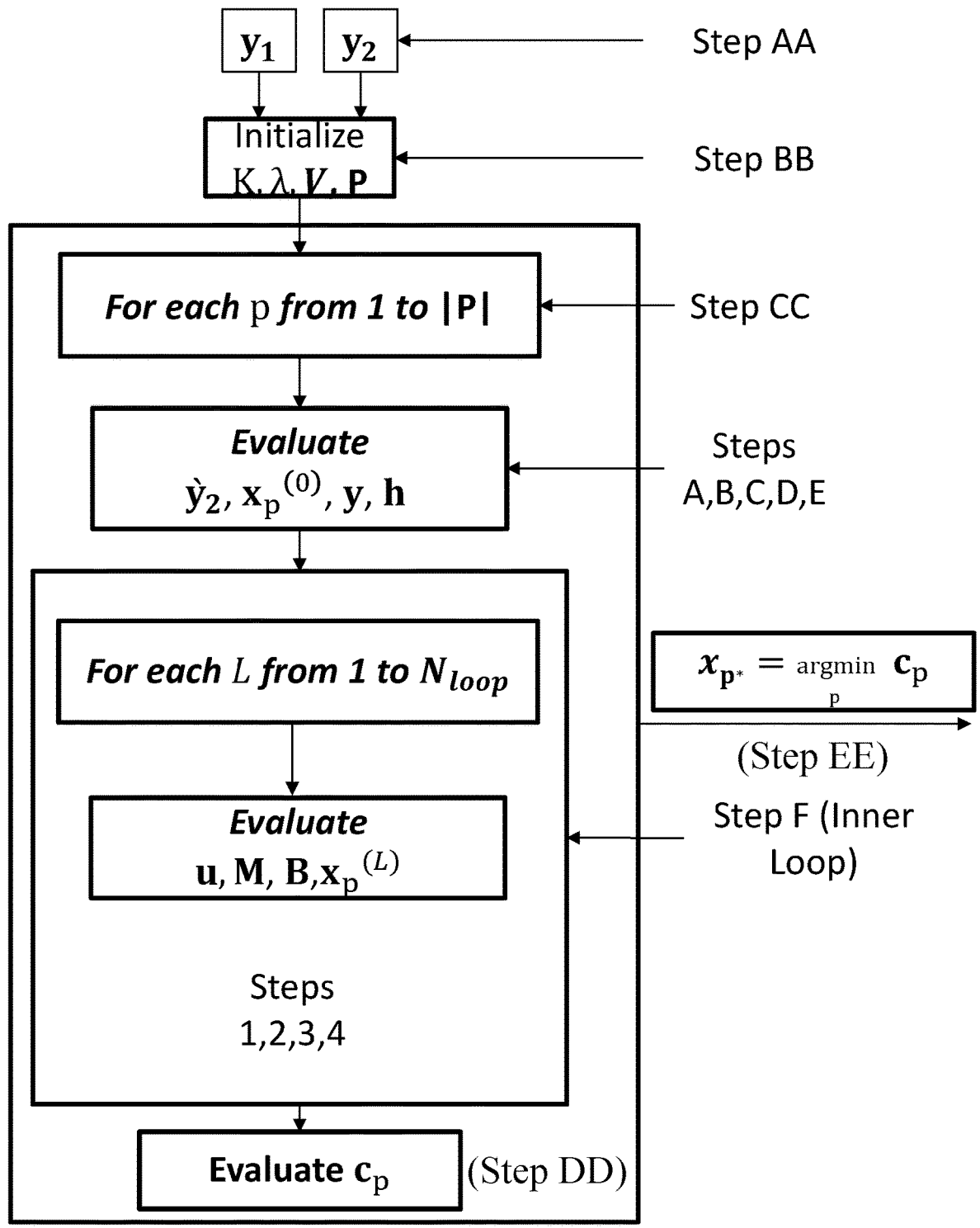
FIG. 3 is a flowchart describing a method of JGSDD, in accordance with embodiments of the present disclosure.

Now referring to FIG. 3 with reference to FIG. 2, FIG. 3 discloses the details of the method of JGSDD introduced in FIG. 2. Now referring to FIG. 3, the method more specifically comprises:

Step AA) Obtain: $Y_1, Y_2$, where $y_1$ and $y_2$ are noisy, base-band samples of a pulse for each channel;

Step BB) Initialize the values of K, λ, V, and P, where K initializes a group over-lap parameter, λ is a regularization parameter, V is a weighting vector that represents uniform, hamming, hanning, or other types of weighting parameter used in the regularization function of Equation (2), P represents a set of P delay values such that $T=\{\sigma_1, \sigma_2 \ldots \sigma_p\}$, and to initialize the value of a variable means to set the vector or scalar to a specific value. Note that we assume that σ* is either in T or there is a close value in T that approximates σ* to a desired accuracy.

Step CC) Outer loop: For each feasible value of $\sigma_p$ indexed by p from 1 to |P| (where p represents an index for the delay values);

Step A) Shift $Y_2$ by $\sigma_p$ sample delays, which, mathematically, can be expressed as $\hat{y}_2 = y_2(n-\sigma_p)$ and where shifting a variable by another variable means to shift the samples of a signal by moving the signal to the left or right along a discrete time axis;

Step B) Initialize the value of L=0 (where l represents the current iteration of the loop);

Step C) Set $x_p^{(0)}=0.5*(y_1+y_2)$, where $x_p^{(L)}$ represents the estimate of x at the $L^{th}$ iteration); Here we have averaged the shifted value $y_2$ derived from step A with that of $y_1$. This is done so that the best candidate estimate of x can be estimated from the two independent measurements;

Step D) Set $y=x_p^{(0)}$ (Initialization Parameter);

Step E) Set $h=D^T y$ (Initialization Parameter);

Step F) Inner Loop: Repeat until convergence for L=1: $N_{loop}$

Step 1) Set $u=D\ x_p^{(L-1)}$, where D is the first order difference operation and u is a temporary variable used in the optimization);

Step 2) $[M]_{n,n} = \Sigma_{j=0}^{k-1} |\Sigma_{k=0}^{k-1} |V_k u(n-j+k)|^2]^{-.5}$, where u is weighted by a window $V_k$, in embodiments rectangular, hamming, hanning, etc.;

Step 3)

$$B = \frac{1}{\lambda}M^{-1} + DD^T,$$

where B is a constant Matrix;

Step 4) $x_p(L)=y-D^T(B^{-1}h)$;

Finish Inner Loop Step F:

Step DD) Evaluate $$c_p^{(L)} = \left\{ \frac{1}{2}\|y_1 - x\|_2^2 + \frac{1}{2}\|\hat{y}_2 - x\|_2^2 + \lambda(\varphi_G(Dx_p)) \right\}$$

Finish Outerloop from step CC:
Final Output is then provided in Step EE, below:
Step EE)

$$x_{p^*} = \underset{p}{\operatorname{argmin}} c_p,$$

from the set of $c_p$ where p represents different delay values $\sigma_p$, choose the index p* that corresponds to the minimum value of $c_p$. Then $x_p^*$ represents the denoised pulse whose pulse-width can be measured by the half point between its rise-time and fall-time.

It should be noted that, for the integer value $N_{loop}$, one can choose a tolerance value that evaluates the successive difference of the solution obtained in the current inner loop $x_p^{(L)}$ relative to the previous inner loop $x_p^{(L-1)}$ for a norm such as the L2 norm. Alternatively, one can choose a number of iterations $N_{loop}$ based to run the iterative optimization solution a priori. Yet another method is to evaluate the difference of $c_p^{(L-1)}$ as function of successive values of L for a norm, such as the L2 norm. Other methods to evaluate convergence to a unique solution would also be known to those of ordinary skill in the art.

Once $x_p^*$ is estimated (i.e. Step EE), then we may estimate the pulse-width of the signal.

We may also solve for a single-channel case by setting the data-fidelity term for the other channel to zero and solving the optimization of Equation (1) separately for each channel. In general, this method utilizes both data-sets independently and, theoretically, should not perform as well as joint-decoding. This method, however, has the advantage of not requiring an optimization to be solved for each candidate delay.

One method to speed up the joint estimation process of embodiments is to solve the single channel to obtain a narrower range of candidate delay values. Another method is to use parallelization, since each candidate delay lends itself to a different optimization program.

Now regarding obtaining the solution of the optimization, a variety of approaches including ADMM, Proximal Splitting Methods, Majorization Minimization, brute-force search, and others, as would be known to one of ordinary skill in the art, can be used to solve Equation (1). These and other approaches can be found described in the following texts, which are herein incorporated by reference, in their entirety: Afonso, Manya V., José M. Bioucas-Dias, and Mário AT Figueiredo. "An augmented Lagrangian approach to the constrained optimization formulation of imaging inverse problems." IEEE Transactions on Image Processing 20.3 (2011): 681-695; Combettes, Patrick L., and Jean-Christophe Pesquet. "Proximal splitting methods in signal processing." Fixed-point algorithms for inverse problems in science and engineering. Springer, New York, NY, 2011.185-212; and Figueiredo, Mirio A T, Jose M. Bioucas-Dias, and Robert D. Nowak. "Majorization-minimization algorithms for wavelet-based image restoration." IEEE Transactions on Image processing 16.12 (2007): 2980-2991.

It should be noted that, given the filter operations are banded matrices, the solution of Equation (1) can, in general, involve banded matrixes, which are efficient from a numerical computational implementation.

It should be noted that in RF congested environment, the model in Equation (1) can be extended so that pulse-width may be accurately estimated despite the colored noise interference. Here colored noise interference can be induces by other RF emitters whose frequency intensities may add up non-uniformly over the frequency band of the receiver that is estimating the pulse-width.

With reference to Equation (1), we consider the case of a very general estimation problem involving an N-dimensional signal, x, corrupted by additive white Gaussian noise (AWGN), v, and additive colored noise interference $c_i$, with multiple observations $y_i$, where each observation has a separate amplitude scale $\epsilon_i \in \mathcal{E}$ and delay $\sigma_i \in \sigma$, to give $y_i = \epsilon_i x(n-\sigma_i) + v_i + c_i$.

We consider the case of a signal observation which can be generalized to multiple observations by searching over a delay space, as described in the details of the JGSDD algorithm above.

We thus consider an N sample observation $y(n)=x(n)+v(n)+c(n)$ where $x(n)$ is the signal of interest containing the pulse, $v(n)$ is Gaussian noise, and $c(n)$ is colored noise. We then assume that the power spectral density of $c(n)$ can be estimated and is given by $p(k)$ where p is the power spectral density of the colored noise interference and k denotes the discrete frequency index. We also assume that N is also the dimension of the power spectral density vector although this number can vary without effecting the optimization formulation that is to be described below.

Consider the power spectral density p, we write S=diag (p), where P is a diagonal matrix whose elements have a one-to-one correspondence in the same ordered p. In an optimization formulation, it makes sense to provide more weight to the frequencies that have less interference. We denote the forward discrete Fourier transform operator by F and the inverse discrete Fourier transform by $F^H$. It should be noted that, in a real system, these operations are typically perform using the fast Fourier transform (FFT) algorithm.

Consequently we modify Equation (1) and solve our optimization problem in the frequency domain:

$$\{x^*\} = \left\{ \operatorname*{argmin}_{x} \frac{1}{2} \left\| \frac{Fy - Fx}{\sqrt{S}} \right\|_2^2 + \lambda \varphi(DF^H Fx) \right\} \quad \text{Equation (3)}$$

It should be noted that if P has a flat spectrum, then by the use of Parseval's theorem, Equation (3) becomes a special case of Equation (1) for each term in the sum in (1).

In order to further illustrate the solution of Equation (3), without any limitation, we assume K=1 in Equation (2), and solve the problem for L1-norm:

$$\{x^*\} = \left\{ \operatorname*{argmin}_{x} \frac{1}{2} \left\| \frac{Fy - Fx}{\sqrt{S}} \right\|_2^2 + \lambda |DF^H Fx| \right\} \quad \text{Equation (4)}$$

To simplify notation, we denote $$\tilde{Y} = \frac{Fy}{\sqrt{S}} \text{ and } \tilde{X} = \frac{Fx}{\sqrt{S}}$$

to obtain:

$$\{\tilde{X}^*\} = \left\{ \operatorname*{argmin}_{\tilde{X}} \frac{1}{2} \|\tilde{X} - \tilde{Y}\|_2^2 + \lambda |DF^H \sqrt{S} \tilde{X}| \right\} \quad \text{Equation (5)}$$

To solve Equation (5), we use the Majorization Minimization (MM) algorithm to upper-bound Equation (5). More specifically, using the identity $$g(t) = \frac{1}{2|s|} t + \frac{1}{2}|s|^2 \geq |t|$$

which equals to |t| when s=t. Using this upper-bound and following the steps of the MM algorithm, the solution for the $(L+1)^{th}$ iteration relative to the $L^{th}$ iteration can be derived as:

$$\tilde{X}^*_{L+1} = (I + \lambda (DF^H \sqrt{S})^H \Delta_L^{-1} (DF^H \sqrt{S}))^{-1} \tilde{Y} \quad \text{Equation (6)}$$

Where $\Delta L = \operatorname{diag}(|DF^H \sqrt{S} \tilde{X}_L|)$. The term $\Delta_L$ can have some elements that are zero or close to zero which can affect the numerical stability of the inverse $\Delta_L^{-1}$. To circumvent this, embodiments use the matrix inverse Lemma in Equation (6) to obtain:

$$\{\tilde{X}^*_{L+1}\} = \tilde{Y} - (DF^H \sqrt{S})^T \left( \frac{1}{\lambda} \operatorname{diag}(|DF^H \sqrt{S} \tilde{X} L|) + (DF^H \sqrt{S})(DF^H \sqrt{S})^H \right)^{-1} (DF^H \sqrt{S}) \tilde{Y} \quad \text{Equation (7)}$$

We note that Equation (7) contains $\Delta_L$ rather than $\Delta_L^{-1}$, which improves the numerical stability of the iterative equation.

Now the inverse terms in both Equations (6) and (7) may be a dense matrix due to the F and $F^H$ operations. In embodiments, a numerical algorithm such as a gradient search, conjugate gradient search, conjugate gradient method with a preconditioner, etc. is used to speed-up the calculation of the inverse. The reference [Shewchuk, Jonathan Richard. "An introduction to the conjugate gradient method without the agonizing pain." (1994)]: discusses the conjugate gradient method and the preconditioned conjugate gradient method in detail. To solve the inverse term of Equation (7) written below as Equations (8a) and 8(b):

$$\left(\frac{1}{\lambda}\text{diag}(|DF^H\sqrt{S}\,\tilde{X}L|) + (DF^H\sqrt{S})(DF^H\sqrt{S})^H\right)^{-1} = \quad \text{Equation (8a)}$$

$$\left(\frac{1}{\lambda}\text{diag}(|DF^H\sqrt{S}\,\tilde{X}L|) + (DF^H SFD^H)\right)^{-1} \quad \text{Equation (8b)}$$

Looking at the term in Equation (8b), one way to numerically solve for the inverse, without inverting the matrix, is to use the conjugate gradient method with a preconditioner. Also the FFT matrix and the D difference operation can be performed without actual matrix functions but rather as an actual FFT and difference filtering operation. As a non-limiting example, we consider the following preconditioner in Equation (9) to evaluate the inverse of Equation (8b) using the preconditioned conjugate gradient (PCG) algorithm:

$$\left(\frac{1}{\lambda}I + (DD^T)\right) \quad \text{Equation (9)}$$

Since $(DD^T)$ is a sparse matrix, and I is diagonal, the inverse of Equation (9) can be calculated in linear time.

We now outline the steps for pulse-width estimation in RF congested environment.

Figure 4:
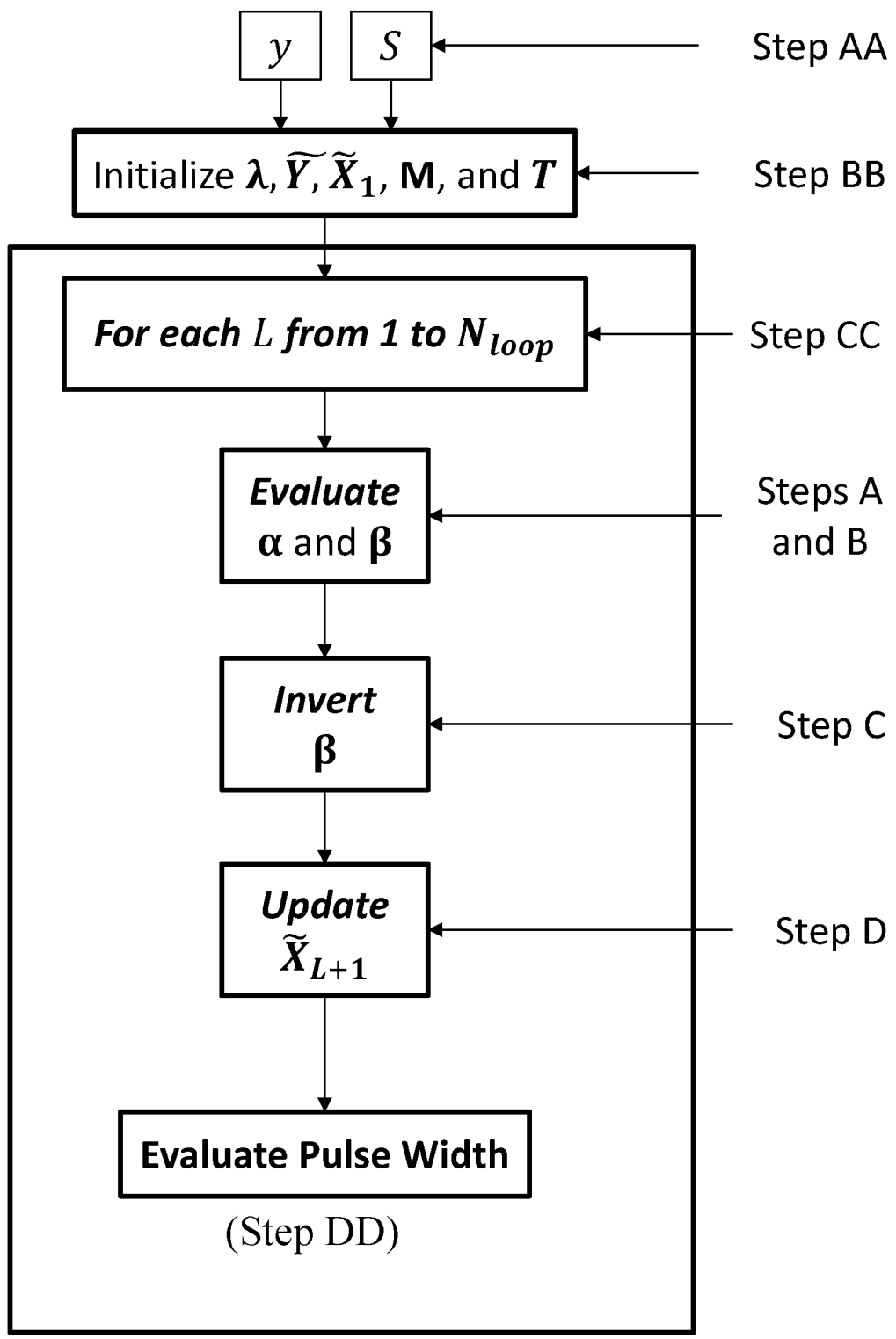
FIG. 4 is a flowchart describing a method of JGSDD that is particularly suitable for colored noise environments, in accordance with embodiments of the present disclosure, in accordance with embodiments of the present disclosure.

Now referring to FIG. 4, a method of denoising for RF congested environments is described. More specifically, the method comprises:

Step AA) Obtain: y and S

Step BB) Initialize the values of $\lambda$, $$\tilde{Y} = \frac{Fy}{\sqrt{S}},\ \tilde{X}_1 = \frac{Fy}{\sqrt{S}},\ M = \left(\frac{1}{\lambda}I + (DD^T)\right) \text{ and } T = DF^H SFD^H$$

Step CC) Repeat until convergence for L=1: $N_{loop}$−1

Step A) Evaluate $$\alpha = \frac{1}{\lambda}\text{diag}(|DF^H\sqrt{S}\,\tilde{X}L|)$$

Step B) Evaluate β=α+T

Step C) Invert β using the preconditioned gradient algorithm (PCG) using a preconditioner such as $$M = \left(\frac{1}{\lambda}I + (DD^T)\right)$$

Step D) Update $\tilde{X}_{L+1} = \tilde{Y} - (DF^H\sqrt{S})\beta^{-1}(DF^H\sqrt{S})\tilde{Y}$ Step DD) Evaluate the pulse-width based on $\tilde{X}^*_{N_{loop}}$ by calculating the time between the half value of the rising and trailing edge of the pulse.

SAMPLE EXPERIMENTAL RESULT

We illustrate the above approach by the following pulse-width measurement experiment tabulated in Table 1 using the method described in algorithm 2 which JGSDD with colored noise modification:

TABLE 1

Parameters of the Pulse-Width Experiment

| Rise-Time | Pulse-Width | Sampling Rate | Signal-to-Noise Ratio (dB) | Signal-to-Interference Ratio (dB) |
|---|---|---|---|---|
| 9.88 nano-seconds | 482.44 nano-seconds | 1600 MHz | 8.51 dB | −26.158 |

Figure 5:
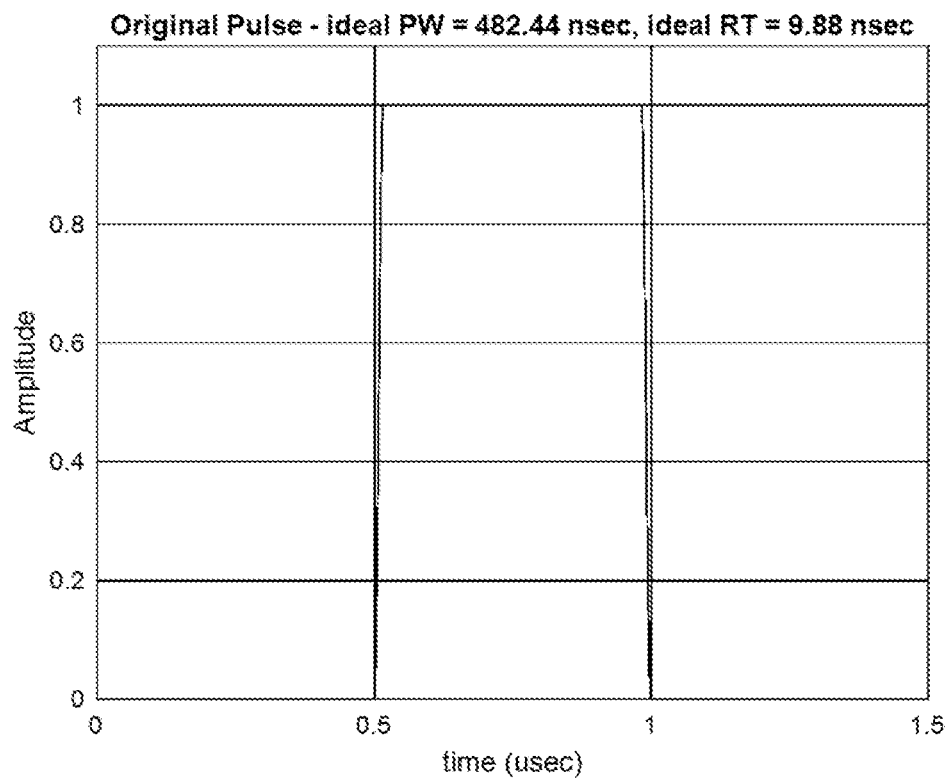
FIG. 5 is a graph showing the pulse vs time, as configured in Table 1, by comparing pulse amplitude to time.
Figure 6:
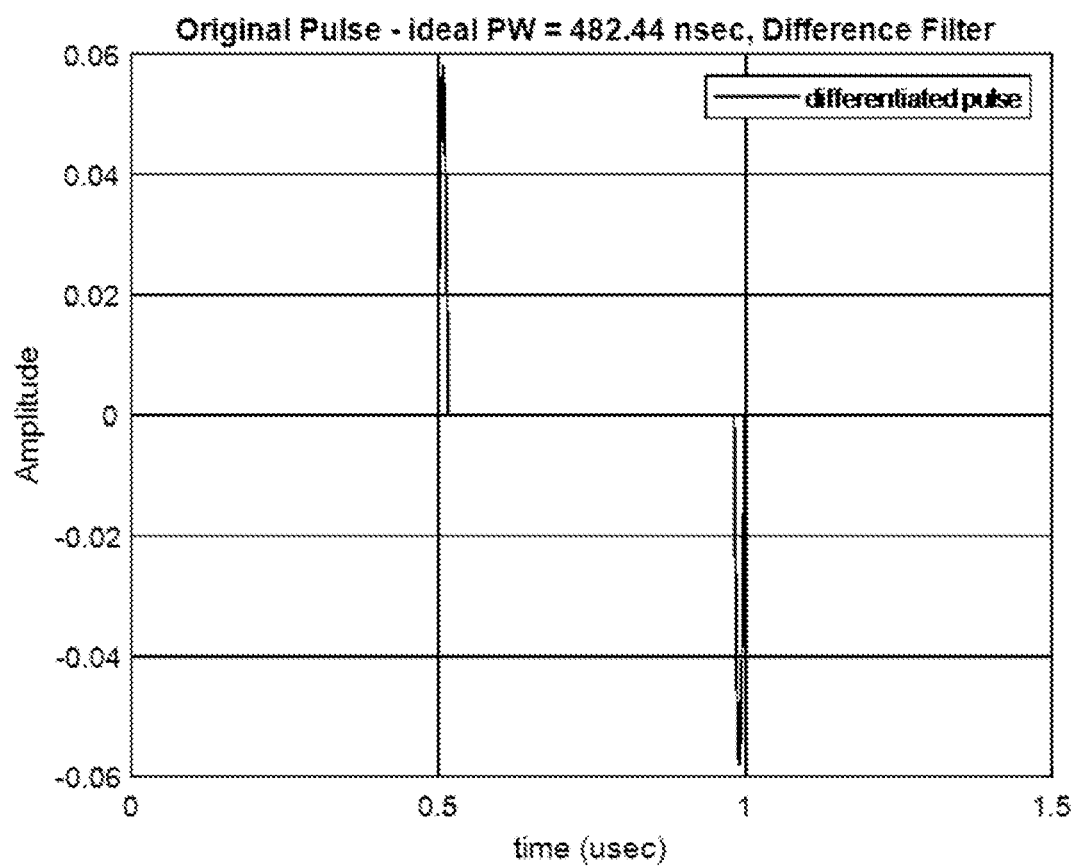
FIG. 6 is a graph showing differentiation filter rise time, i.e. the derivative of the pulse shown in FIG. 5.
Figure 7:
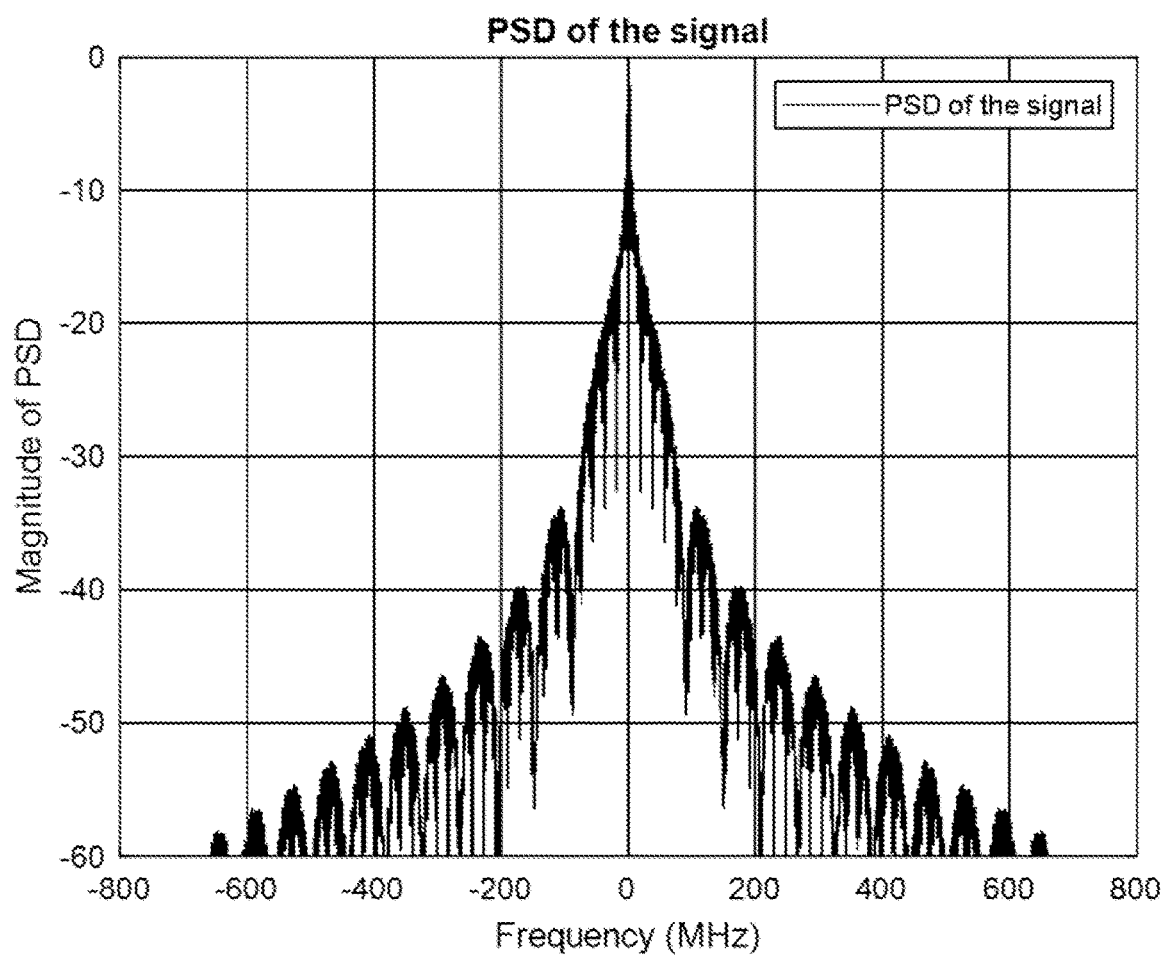
FIG. 7 is graph showing the power spectral density (PSD) of the pulse in FIG. 5.
Figure 8:
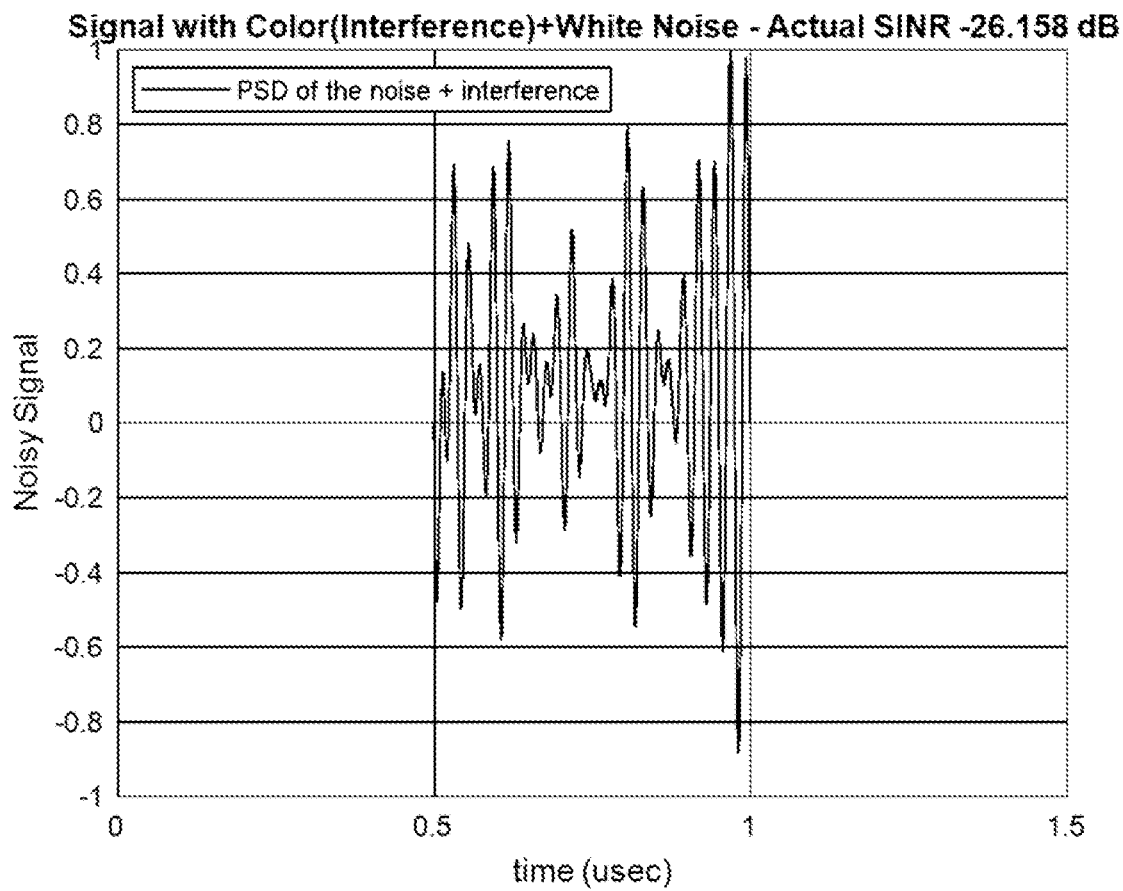
FIG. 8 is a graph showing the power spectral density (PSD) of the interference plus noise.
Figure 9:
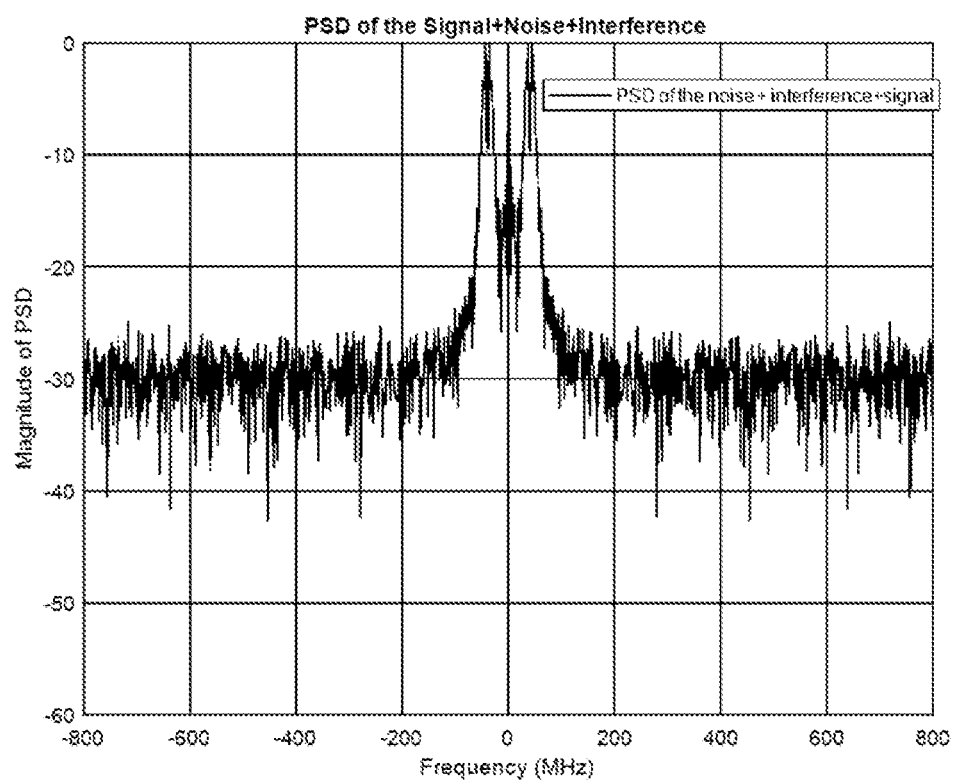
FIG. 9 is a graph showing the power spectral density (PSD) of the interference plus noise plus the signal of FIG. 5.
Figure 10:
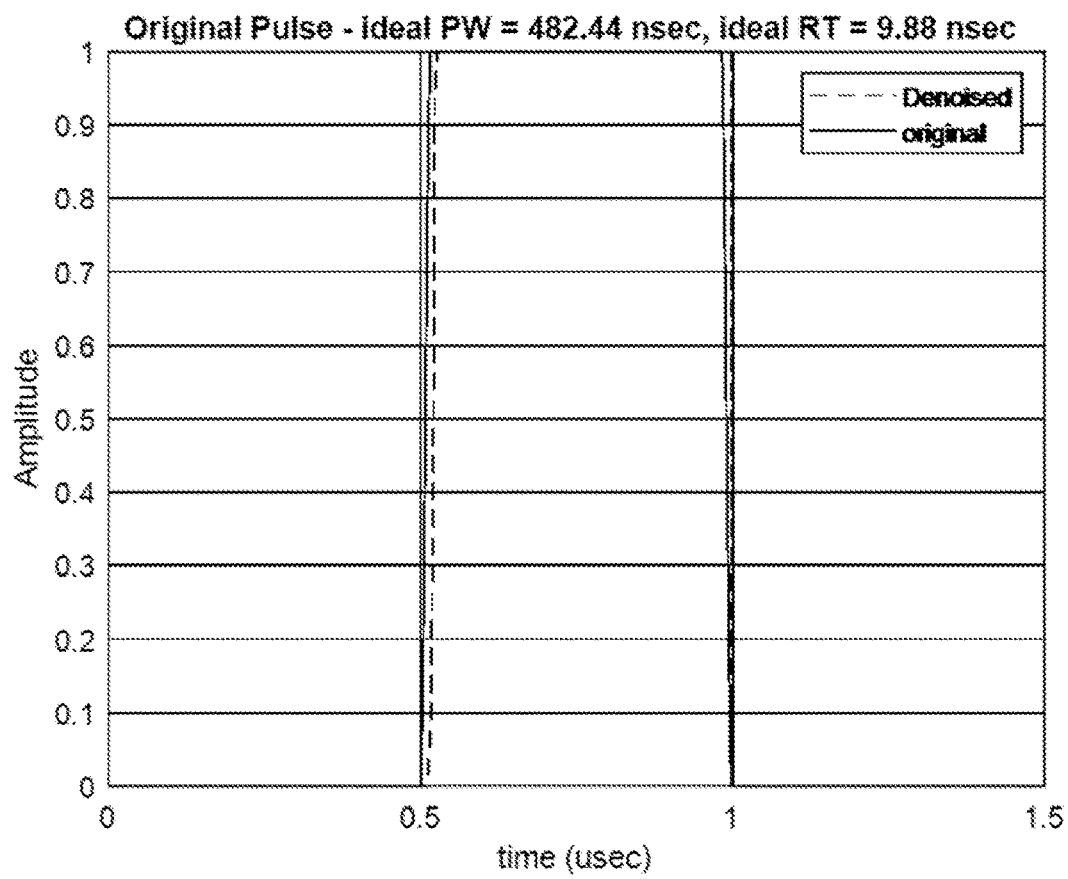
FIG. 10 is a graph showing the pulse vs time of FIG. 5 and the estimated pulse whose power spectral density is shown in FIG. 9.

FIG. 5 illustrates the pulse based on the parameters tabulated in Table 1. FIG. 6 shows that the derivative coefficients of the pulse are sparse. FIG. 7 shows the power spectral density (PSD) of the ideal pulse. When noise and interference are added as parameterized in Table 1, the pulse suffers distortion, as shown in FIG. 8. FIG. 9 shows the PSD of the signal embedded in noise and interference. FIG. 10 plots the time vs amplitude of the ideal pulse and the recovered pulse using the algorithm described in FIG. 4. Relative to the ideal pulse-width, the pulse-width was estimated at 477.83 nano-seconds. It should be noted that in the case of the pure signal to noise without colored noise inference, the actual measured pulse-width after the JGSDD algorithm was 482.80 nano-seconds, relative to the ideal of 482.44 nano-seconds.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

What is claimed is:

1. A (non-transitory) computer program product including one or more machine-readable mediums encoded with instructions that when executed by one or more processors cause a process to be carried out for feature detection, the process comprising:
   applying a joint group sparse denoising and delay estimation approach to a signal received from said signal source; and
   outputting statistics regarding the signal,
   wherein the joint group sparse denoising and delay estimation approach comprises:
   using the following equation:

$$\{x^*, \tau^*\} = \underset{x, \in, \tau}{\text{argmin}}\left\{\frac{1}{2}\sum_{j=1}^{M}\|y_i - x\|_2^2 + \sum_{i=0}^{N}\lambda_i\phi_i(D_i^{l_i}x)\right\}$$

where:
   $\phi_i$ are regularization functions,
   $\|y-x\|_2^2$ is a data-fidelity term and, in embodiments, is chosen as the least-square term,
   $l_i$ are real numbers, D$_i$ are operators, which may be linear filters that can be written in matrix form, λ$_i$ are regularization parameters, and x*,σ* represent estimates of at least one transmitted pulse and associated delay, respectively;

solving the equation for multiple values of σ*;

choosing a vector, x, such that a cost function comprising the data fidelity term and regularization function is minimized;

determining the σ* that corresponds to the x that minimizes the cost function;

calculating the pulse width of the received signal, which corresponds to the desired estimate of the vector, x.

2. A feature detection system, the system comprising: at least one processor in operative communication with a signal source and the (non-transitory) computer program product of claim 1.

3. The system of claim 2, wherein the signal source is a receiver configured to receive electromagnetic radiation.

4. The system of claim 2, wherein said statistics regarding the signal are selected from the group consisting of pulse width, amplitude, peak values, locations of peaks and troughs, periodicity or lack thereof, aperiodicity, spectral signature, and peak values at different periodicities.

5. The system of claim 2, wherein the regularization function models a priori knowledge of characteristics of the signal, x.

6. The system of claim 2, wherein the regularization function comprises a mixed norm, the mixed norm being: $\phi_G(x)=\Sigma_{i=1}^{N}|\Sigma_{k=0}^{K-1}V_k|x(i+k)^2|^{1/2}$, where: K represents a group size and $V_k$ is a window function.

7. The system of claim 6 wherein the window function is uniform.

8. The system of claim 2, wherein the regularization function is selected from the group consisting of $l_1$ norm or $l_0$ norm, nuclear norm, sparsity promoting functions, non-convex penalties, group sparse functions, total variation, mixed norms, Huber loss functions, sparsity in a transform domain, sparsity using prior knowledge, and structure in time-frequency transforms.

9. A method of extracting the pulse-width of signals, the method comprising:

receiving a first signal, y$_1$, and a second signal, y$_2$; and determining the pulse width of the signals using the following equations:

where:

$$\{x^*, \tau^*\} = \underset{x,\epsilon,\tau}{\operatorname{argmin}}\left\{\frac{1}{2}\sum_{j=1}^{M}\|y_i - x\|_2^2 + \sum_{i=0}^{N}\lambda_i\phi_i(D_i^{l_i}x)\right\}$$

$$\varphi_G(x) = \sum_{i=1}^{N}\left[\sum_{k=0}^{K-1}V_k|x(i+k)|^2\right]^{1/2}$$

φ$_i$ are regularization functions,

φ$_G$(X) represents a special case of a general sum of φ$_i$,

K represents a group size,

V$_k$ is a window function, $\|y-x\|_2^2$ is a data-fidelity term, l$_i$ are real numbers, D$_i$ are operators, which may be linear filters that can be written in matrix form, λ$_i$ are regularization parameters, and x*,σ* represent estimates of at least one transmitted pulse and associated delay, respectively, wherein determining the pulse width of the signals following receiving the first and second signals further comprises:

initializing K,λ,V, and P, where P represents a set of P delay values such that T={σ$_1$, σ$_2$ ... σ$_P$};

for each feasible value of σ$_p$ indexed by p from 1 to |P|, where p represents an index for the delay values:

shifting y$_2$ by σ$_p$ sample delays;

initializing the value of L=0;

setting $x_p^{(0)}=0.5*(y_1+\hat{y}_2)$, where $x_p^{(L)}$ represents an estimate of x at an $L^{th}$ iteration;

setting $y=x_p^{(0)}$; and setting h=D$^T$y, where D$^T$ is a transpose of a first order difference operation;

then performing the following loop, which is repeated until convergence for L=1: N$_{loop}$:

setting $u=Dx_p^{(L-1)}$, where D is the first order difference operation and u is a temporary variable;

solving $[M]_{n,n}=\Sigma_{j=0}^{K-1}|\Sigma_{k=0}^{K-1}|V_k u(n-j+k)|^2]^{-.5}$, where u is weighted by a window $V_k$;

solving $$B = \frac{1}{\lambda}M^{-1} + DD^T,$$

where B is a constant matrix;

solving $x_p^{(L)}=y-D^T(B^{-1}h)$;

evaluating $$c_p^{(L)} = \left\{\frac{1}{2}\|y_1 - x\|_2^2 + \frac{1}{2}\|\hat{y}_2 - x\|_2^2 + \lambda(\varphi_G(Dx_p))\right\};$$

using the following equation:

$$x_{p^*} = \underset{p}{\operatorname{argmin}} c_p,$$

from the set of c$_p$ where p represents different delay values σ$_p$, choosing the index p* that corresponds to the minimum value of c$_p$; and using x$_p$, which represents a denoised pulse whose pulse width can be measured by the half point between its rise-time and fall-time, to determine the pulse width of at least one signal.

10. The method of claim 9 wherein $\|y-x\|_2^2$ is chosen as a least-square term.

11. The method of claim 9 wherein x$_p$ is used to calculate the pulse width of both signals.

12. The method of claim 9 wherein for the integer value N$_{loop}$, a tolerance value that evaluates the successive difference of the solution obtained in the current inner loop $x_p^{(L)}$ relative to the previous inner loop $x_p^{(L-1)}$ for a norm is used.

13. The method of claim 12 wherein the norm is an L2 norm.

14. The method of claim 9 wherein a number of iterations of N$_{loop}$ are used to run the iterative optimization solution a priori.

15. The method of claim 9 wherein a single-channel case is solved for by setting the data-fidelity term for the signal on a channel not being solved for to zero and performing the method of claim 9 separately for each channel.

16. The method of claim 15 wherein the preconditioner comprises $$M = \left(\frac{1}{\lambda}I + (DD^T)\right).$$

17. A method of extracting a pulse-width of a signal or signals in the presence of RF interference, the method comprising:

using a receiver and/or the following equation:

$$\{x^*\} = \left\{\operatorname*{argmin}_{x} \frac{1}{2}\left\|\frac{Fy - Fx}{\sqrt{S}}\right\|_2^2 + \lambda |DF^H Fx|\right\}$$

obtaining y and S;
initializing the values of $\lambda$, $$\tilde{Y} = \frac{Fy}{\sqrt{S}}, \tilde{X}_1 = \frac{Fy}{\sqrt{S}},$$

and T=DF$^H$SFD$^H$;
repeating the previous steps until convergence for L=1: $N_{loop}-1$;
evaluating $$\alpha = \frac{1}{\lambda}\operatorname{diag}(|DF^H \sqrt{S}\tilde{X}_L|);$$

evaluating=α+T;
inverting β using a preconditioned gradient algorithm;
updating $\tilde{X}_{L+1} = \tilde{Y} - (DF^H\sqrt{S})^T \beta^{-1}(DF^H\sqrt{S})\tilde{Y}$; and
evaluating a pulse-width of the signal based on $\tilde{X}^*_{N_{loop}}$ by calculating the time between the half value of the rising and trailing edge of the pulse, wherein:
y represents noisy, base-band samples of a pulse,
S represents diag(p), where p represents power spectral density and P is a diagonal matrix whose elements have a one-to-one correspondence in the same ordered p,
$\lambda$ is a regularization parameter,
$\tilde{Y}$ represents a Fourier transform of received data normalized by a colored noise interference spectral pattern,
$\tilde{X}_1$ represents an initial guess for an estimate of the pulse,
Fy represents Fourier transform of the received channel data
T represents a constant that is equal to DF$^H$SFD$^H$, which is a left and right Fourier Transform and left and right difference filtered power spectrum of the colored noise,
D represents a difference filter,
F$^H$ represents an inverse Fourier Transform
F represents a forward Fourier Transform
D$^H$ represents a Hermitian transpose of the difference filter,
$\tilde{X}_L$ represents an ith iteration estimate of the Fourier transform of the pulse normalized by the colored noise interference spectral pattern,
α represents a matrix that is a function of ith estimate of the pulse weighted by its colored noise interference pattern, inverse Fourier transform, and the difference filter matrix, and
β represents a parameter that varies with each iteration of the algorithm and is the sum of T+α.

18. The method of claim 17 wherein said statistics regarding the signal comprise statistics relevant to detection and classification of a waveform.

19. The method of claim 17 wherein said statistics regarding the signal comprise an identification of a transmitter.

20. The method of claim 17 wherein the step of initializing values further comprises initializing a preconditioner and the step of inverting β using the preconditioned gradient algorithm further comprises using the preconditioner.

* * * * *